(12) United States Patent
Korol et al.

(10) Patent No.: US 10,075,138 B2
(45) Date of Patent: Sep. 11, 2018

(54) INDUCTOR SHIELDING

(71) Applicant: QUALCOMM Incorporated, San Diego, CA (US)

(72) Inventors: Victor Korol, San Diego, CA (US); Mina Iskander, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 172 days.

(21) Appl. No.: 14/880,631

(22) Filed: Oct. 12, 2015

(65) Prior Publication Data

US 2017/0104459 A1   Apr. 13, 2017

(51) Int. Cl.
| | | |
|---|---|---|
| H01F 27/36 | (2006.01) | |
| H01F 27/32 | (2006.01) | |
| H03F 1/56 | (2006.01) | |
| H01F 27/28 | (2006.01) | |
| H03F 3/193 | (2006.01) | |
| H03F 3/21 | (2006.01) | |
| H03H 7/38 | (2006.01) | |
| H01F 17/00 | (2006.01) | |

(52) U.S. Cl.
CPC ......... *H03F 1/565* (2013.01); *H01F 17/0013* (2013.01); *H01F 27/288* (2013.01); *H01F 27/32* (2013.01); *H01F 27/36* (2013.01); *H03F 3/193* (2013.01); *H03F 3/211* (2013.01); *H03H 7/38* (2013.01); *H01F 2017/008* (2013.01); *H03F 2200/451* (2013.01); *H03F 2203/21106* (2013.01)

(58) Field of Classification Search
CPC .......................................... H01F 27/00–27/36

USPC .............................. 336/84 R, 84 C, 200, 232
See application file for complete search history.

(56) References Cited

U.S. PATENT DOCUMENTS

| | | | | |
|---|---|---|---|---|
| 5,959,522 A | * | 9/1999 | Andrews ................... | H01F 7/08 336/200 |
| 6,424,820 B1 | * | 7/2002 | Burdick ............... | H04B 5/0081 455/132 |
| 6,593,838 B2 | * | 7/2003 | Yue ..................... | H01F 17/0006 257/531 |
| 6,833,603 B1 | * | 12/2004 | Park .................... | H01F 17/0006 257/528 |
| 7,323,948 B2 | * | 1/2008 | Ding ................... | H01L 23/5223 257/531 |
| 7,551,052 B2 | | 6/2009 | Jow et al. | |
| 7,911,014 B2 | | 3/2011 | Doan | |
| 8,003,529 B2 | | 8/2011 | Lim et al. | |
| 8,987,839 B2 | | 3/2015 | Liu et al. | |
| 2002/0084509 A1 | * | 7/2002 | Ballantine .......... | H01L 23/5227 257/531 |

(Continued)

OTHER PUBLICATIONS

International Search Report and Written Opinion—PCT/US2016/052269—ISA/EPO—dated Dec. 6, 2016.

*Primary Examiner* — Tuyen Nguyen
(74) *Attorney, Agent, or Firm* — Qualcomm Incorporated-Toler

(57) ABSTRACT

Exemplary embodiments of the present disclosure are related to inductor shielding. A device may include an inductor and a plurality of conductive strips extending across the inductor. At least a first conductive strip of the plurality of conductive strips is physically isolated from at least a second conductive strip of the plurality of conductive strips in a region of overlay of the first and second conductive strips.

20 Claims, 9 Drawing Sheets

(56) References Cited

U.S. PATENT DOCUMENTS

| | | | |
|---|---|---|---|
| 2005/0099228 A1* | 5/2005 | Akatsuka | H01P 1/15 |
| | | | 330/66 |
| 2006/0049481 A1 | 3/2006 | Tiemeijer et al. | |
| 2007/0069717 A1* | 3/2007 | Cheung | H03F 3/211 |
| | | | 324/750.26 |
| 2007/0194852 A1* | 8/2007 | Tsuromaki | H03F 1/302 |
| | | | 330/285 |
| 2008/0029854 A1* | 2/2008 | Hung | H01L 23/5225 |
| | | | 257/659 |
| 2014/0117496 A1 | 5/2014 | Cheng et al. | |

* cited by examiner

INDUCTOR SHIELDING

BACKGROUND

Field

The present disclosure relates generally to inductor shielding. More specifically, the present disclosure includes embodiments related to reducing undesirable magnetic coupling between an inductor and another electrical component.

Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP Long Term Evolution (LTE) systems, 3GPP2 Ultra Mobile Broadband (UMB) systems, and orthogonal frequency division multiple access (OFDMA) systems.

In a communication system, a transmitter may process (e.g., encode and modulate) data. The transmitter may further condition (e.g., convert to analog, filter, frequency upconvert, and amplify) the data to generate an output radio frequency (RF) signal. The transmitter may then transmit the output RF signal via a communication channel to a receiver. The receiver may receive the transmitted RF signal and perform the complementary processing on the received RF signal. The receiver may condition (e.g., amplify, frequency down-convert, filter, and digitize) the received RF signal to obtain input samples. The receiver may further process (e.g., demodulate and decode) the input samples to recover the transmitted data.

A transmitter typically includes a power amplifier (PA), which is a versatile device used in various applications to meet design requirements for signal conditioning, special transfer functions, analog instrumentation, and analog computation, among others. An RF power amplifier may be used to convert a low-power RF signal into a signal of significant power, typically for driving an antenna of a transmitter.

DETAILED DESCRIPTION

The detailed description set forth below in connection with the appended drawings is intended as a description of exemplary embodiments and is not intended to represent the only embodiments in that can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein.

Figure 1:
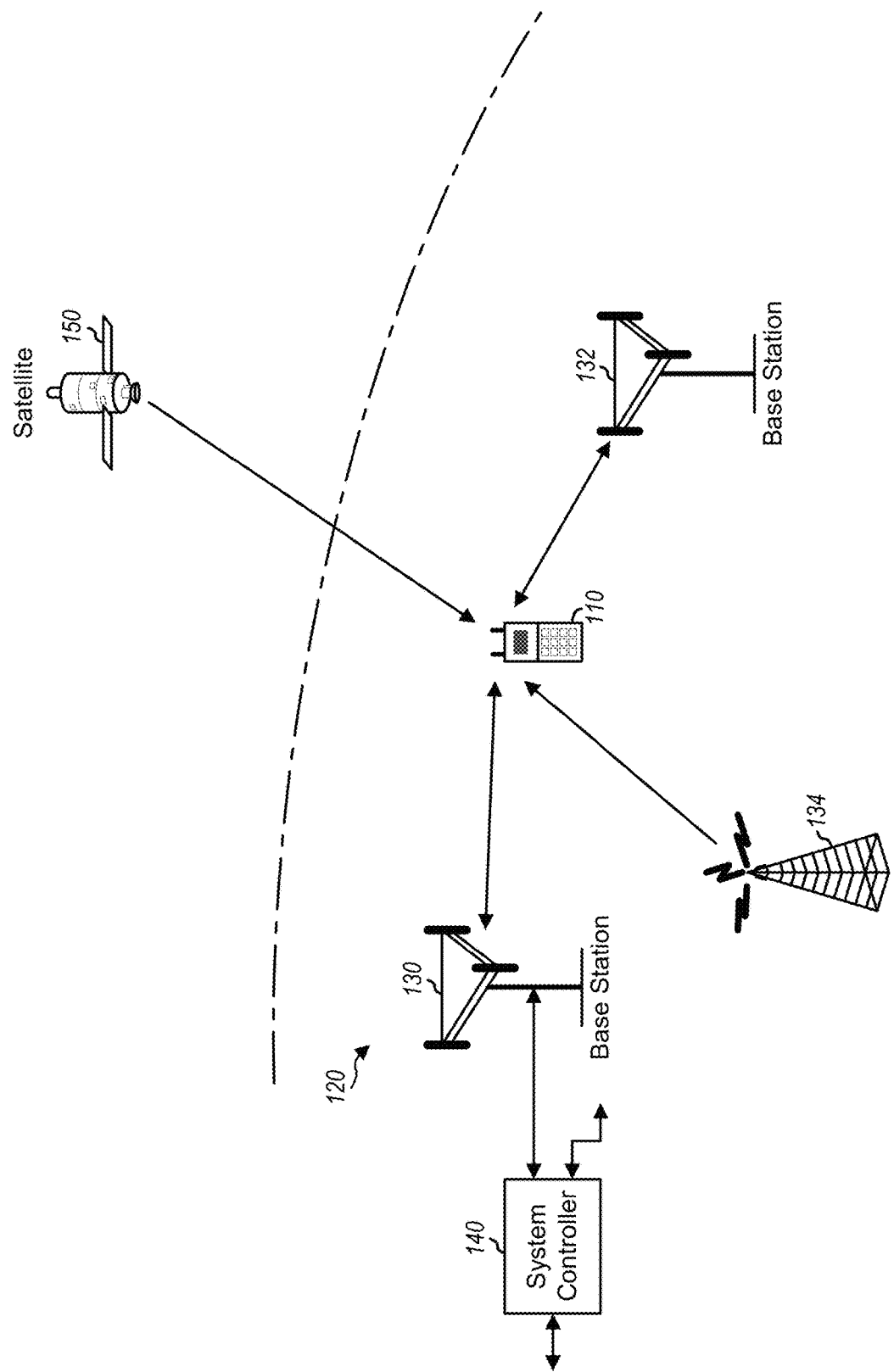
FIG. 1 shows a wireless device communicating with a wireless system, according to an exemplary embodiment of the present disclosure.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
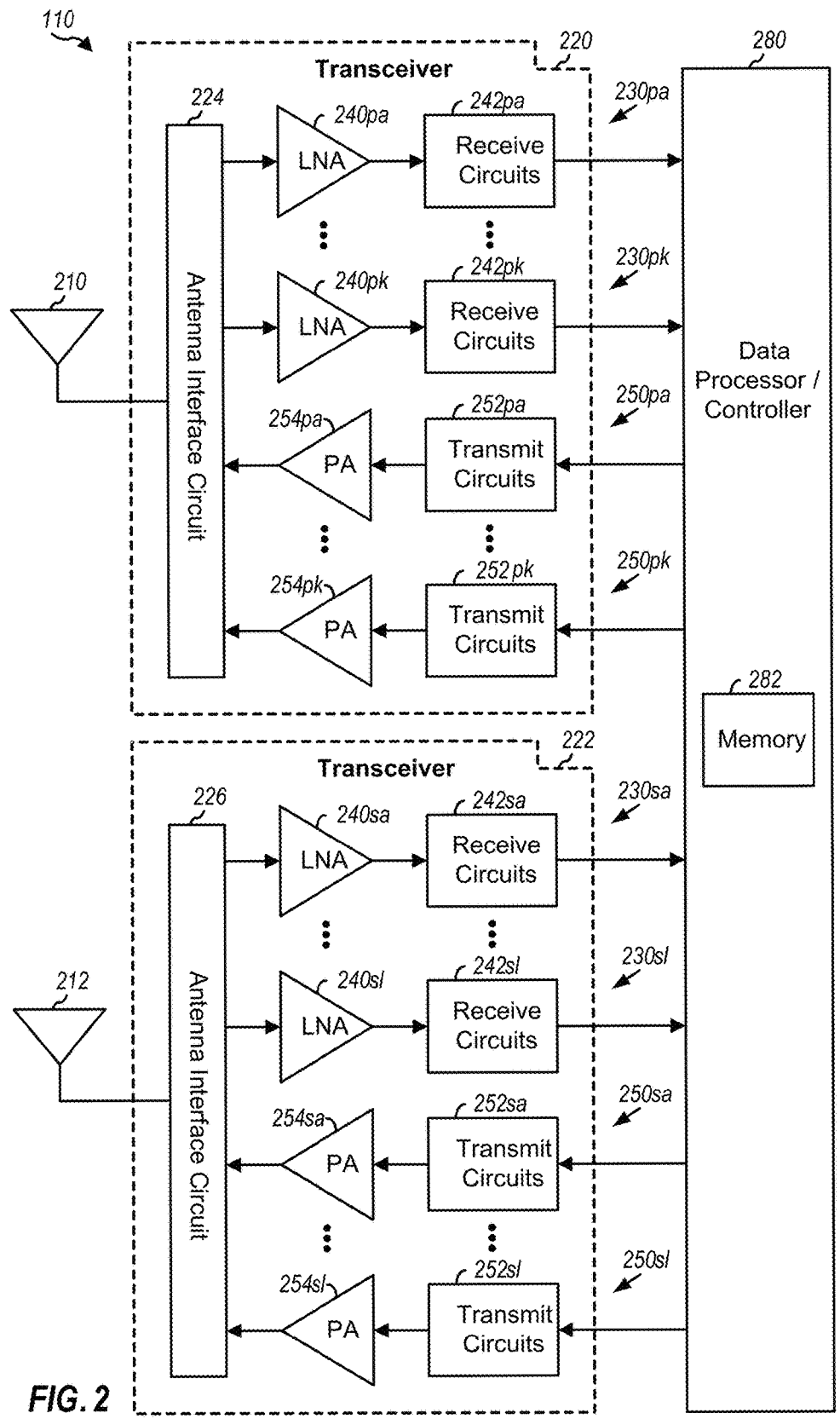
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes L receivers 230sa to 230sl and L transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in a similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in a similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple IC chips, as described below. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support CA and may (i) receive multiple downlink signals transmitted by one or more cells on multiple downlink carriers at different frequencies and/or (ii) transmit multiple uplink signals to one or more cells on multiple uplink carriers. Transmitters and receivers to support CA may be implemented on a single IC chip. However, it may be difficult or not possible to meet isolation requirements between the transmitters and receivers in certain transmit (TX) and receive (RX) bands due to limited pin-to-pin isolation on the IC chip.

For example, in the inter-CA mode, the isolation requirement between some TX and RX bands (e.g., UMTS Bands 4 and 17) may be 100 decibels (dB), which may be difficult or not possible to achieve since pin-to-pin isolation is worse than the isolation requirement. On-chip transmit filtering may improve pin-to-pin RX/TX isolation but (i) may degrade transmitter performance and (ii) may not reduce other RX/TX coupling mechanisms on the same IC chip. Furthermore, spurious signals from multiple PLLs and LO generators operating simultaneously on the same IC chip may degrade transmitter performance. Sensitivity of a receiver may also be degraded due to poor spurious and isolation performance.

In an aspect of the present disclosure, expandable transceivers and receivers implemented on multiple IC chips may be used to support CA and mitigate the problems described above. Transmitters and receivers on the multiple IC chips may be selected for use such that interference between these transmitters and receivers may be mitigated. As an example, for inter-band CA, a transmitter and a receiver on one IC chip may be used for communication on one band, and another transmitter and another receiver on another IC chip may be used for communication on another band. This may mitigate spurious and isolation problems encountered in the single-chip design.

Figure 3:
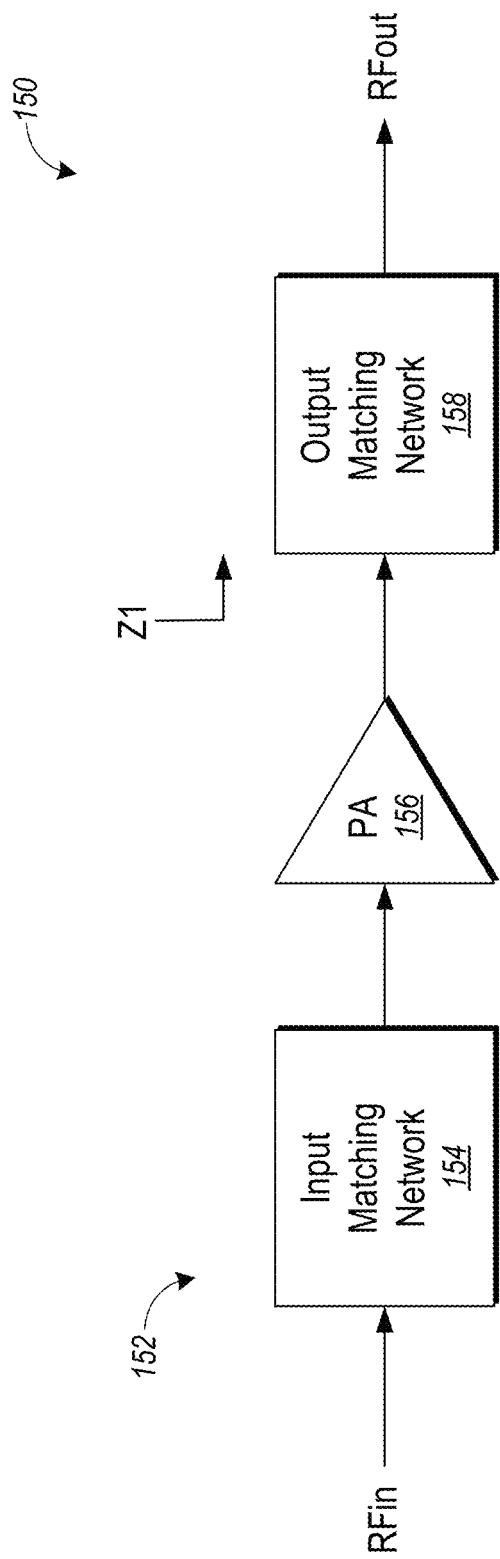
FIG. 3 depicts a transmit path of a transmitter of a wireless communication device, according to an exemplary embodiment of the present disclosure.

FIG. 3 shows a block diagram of a design of a transmitter 150 including transmit path 152 having an input matching network 154, a PA 156, and an output matching network 158. In one embodiment, transmitter 150 may be transmitter 250 as disclosed above and, thus, power amplifier 156 may comprise power amplifier 254 (see FIG. 2). As one example, power amplifier 156 may comprise a gallium arsenide (GaAs) power amplifier. In another example, power amplifier 156 may comprise a CMOS power amplifier.

During operation, an input RF signal RFin is routed through input matching network 154, amplified by power amplifier 156, and routed through output matching network 158, which outputs an output RF signal RFout. Signal RFout may be provided to a load (not shown in FIG. 3), which may be an antenna or some other circuit. Input matching network 154 may perform input impedance matching for power amplifiers 156 and output matching network 158 may perform output impedance matching for power amplifier 156 and provide an impedance of Z1 to power amplifier 156. Further, output matching network 158 may provide an impedance to the load.

As will be appreciated by a person having ordinary skill in the art, an RF PA integrated circuit (IC) may use inductors in input and output matching networks. Small IC size and high amplifier gain may create conditions for significant coupling between the inductors in the input and output matching networks, which may cause undesirable positive feedback and oscillation. Positive feedback in reactively matched gain chains is common for RF ICs, but it is especially acute in silicon-on-insulator (SOI) RF PA because the size of PA ICs are relatively small and the separation between the inductors in the input and output matching networks is small. Further, the area of the inductors is large relative to their inductance (i.e., because RF PA require high-Q inductors at input matching networks and, especially, output matching networks). Large size and/or separation ratio may create undesirable strong coupling between the inductors. Additionally, SOI PA substrates are dielectric, and, thus, do not block magnetic fields. Dielectric SOI substrates may eliminate "substrate current" coupling, but the magnetic coupling between the on-Si and on-Laminate inductors exists in full.

As an example, on silicon, a 0.2 millimeter diameter PA input matching inductor may be 1.3 millimeters away from large size universal mobile telecommunication system (UMTS) and global system for mobile communication (GSM) PA output matching inductors. With the PA gain reaching around 40 dB, there is high risk of IN-OUT inductors coupling stronger than −40 dB, which may lead to oscillation conditions.

Figure 4:
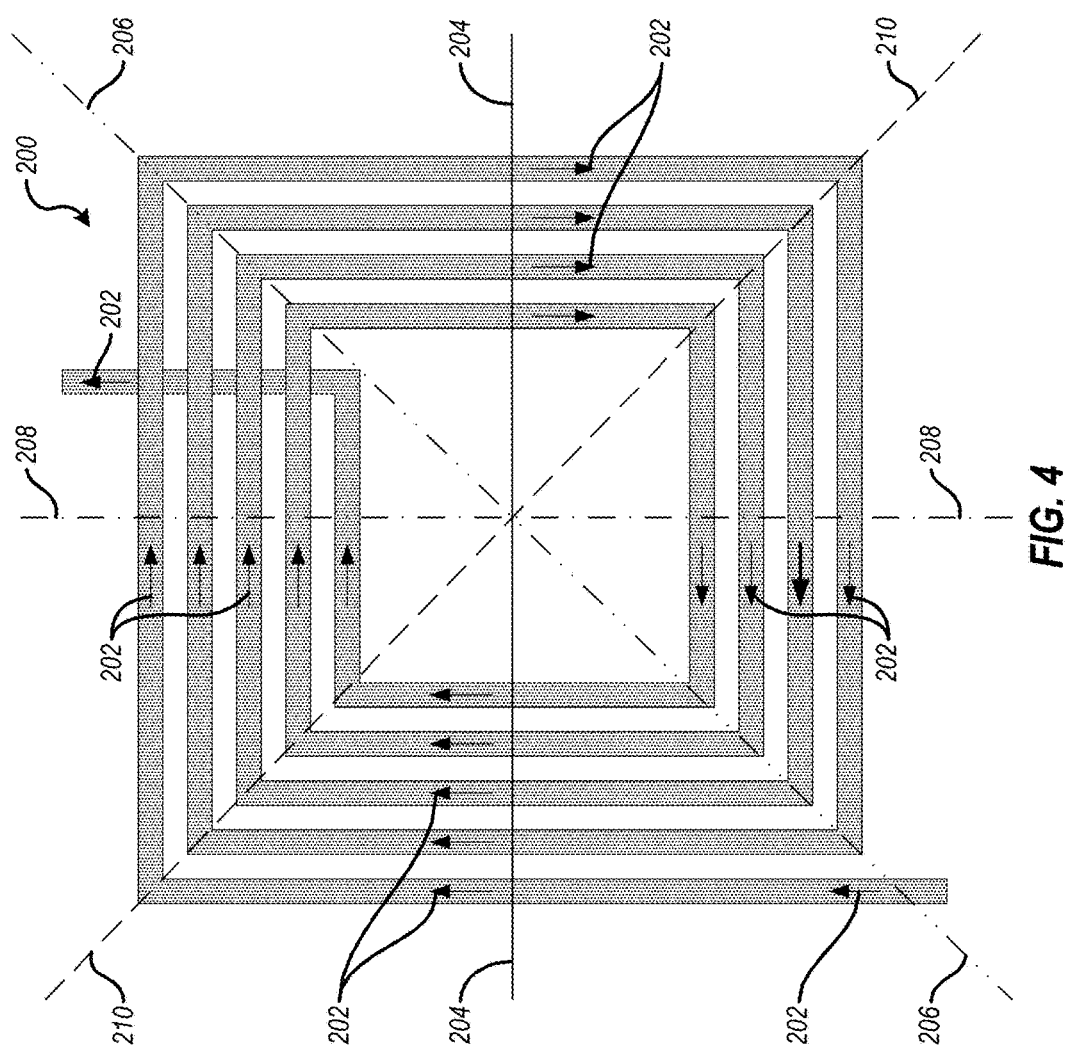
FIG. 4 depicts the planar inductor including a plurality of symmetrical axes.

As will be understood, inductors (e.g., planar inductors) may include one or more axes of symmetry. For example, symmetrical square, round or octagon inductors may include four axes of symmetry. FIG. 4 depicts a spiral inductor 200 including a plurality of axes of symmetry (i.e., four symmetrical axes). Coil currents flowing through inductor 200 are depicted by reference numeral 202. More specifically, FIG. 4 depicts a first symmetrical axis 204, a second symmetrical axis 206, a third symmetrical axis 208, and a fourth symmetrical axis 210.

Exemplary embodiments, as described herein, are directed to devices and methods related to inductor shielding. Exemplary embodiments may improve inductor isolation while maintaining a required Q-factor. According to one exemplary embodiment, a device may include an inductor and a plurality of conductive strips extending across the inductor. At least a first conductive strip of the plurality of conductive strips is physically isolated from at least a second conductive strip of the plurality of conductive strips in a region of overlay (e.g., a region surrounding where the axes 204, 206, 208, and 210 cross) of the first and second conductive strips. The plurality of conductive strips are configured to reduce a magnetic field proximate the at least one conductive strip. More specifically, for example, the plurality of conductive strips are configured to reduce magnetic coupling between the inductor and an electrical component.

According to another exemplary embodiment, a device may include a planar, spiral inductor including at least one axis of symmetry. Further, the device may include at least one conductive wire, wherein each axis of symmetry of the at least one axis of symmetry includes a conductive wire of the plurality of conductive wires extending along thereof.

According to another exemplary embodiment, the present disclosure includes methods for shielding an inductor from a magnetic field. Various embodiments of such a method may include receiving a signal at a circuit including an inductor. The method may also include reducing a magnetic field proximate a plurality of conductive strips extending across the inductor. At least a first conductive strip of the plurality of conductive strips being physically isolated from at least a second conductive strip of the plurality of conductive strips in a region of overlay of the first and second conductive strips. More specifically, for example, the method may include shielding the inductor from the magnetic field generated by an aggressor structure with the conductive strips.

Other aspects, as well as features and advantages of various aspects, will become apparent to those of skill in the art though consideration of the ensuing description, the accompanying drawings and the appended claims.

Figure 5:
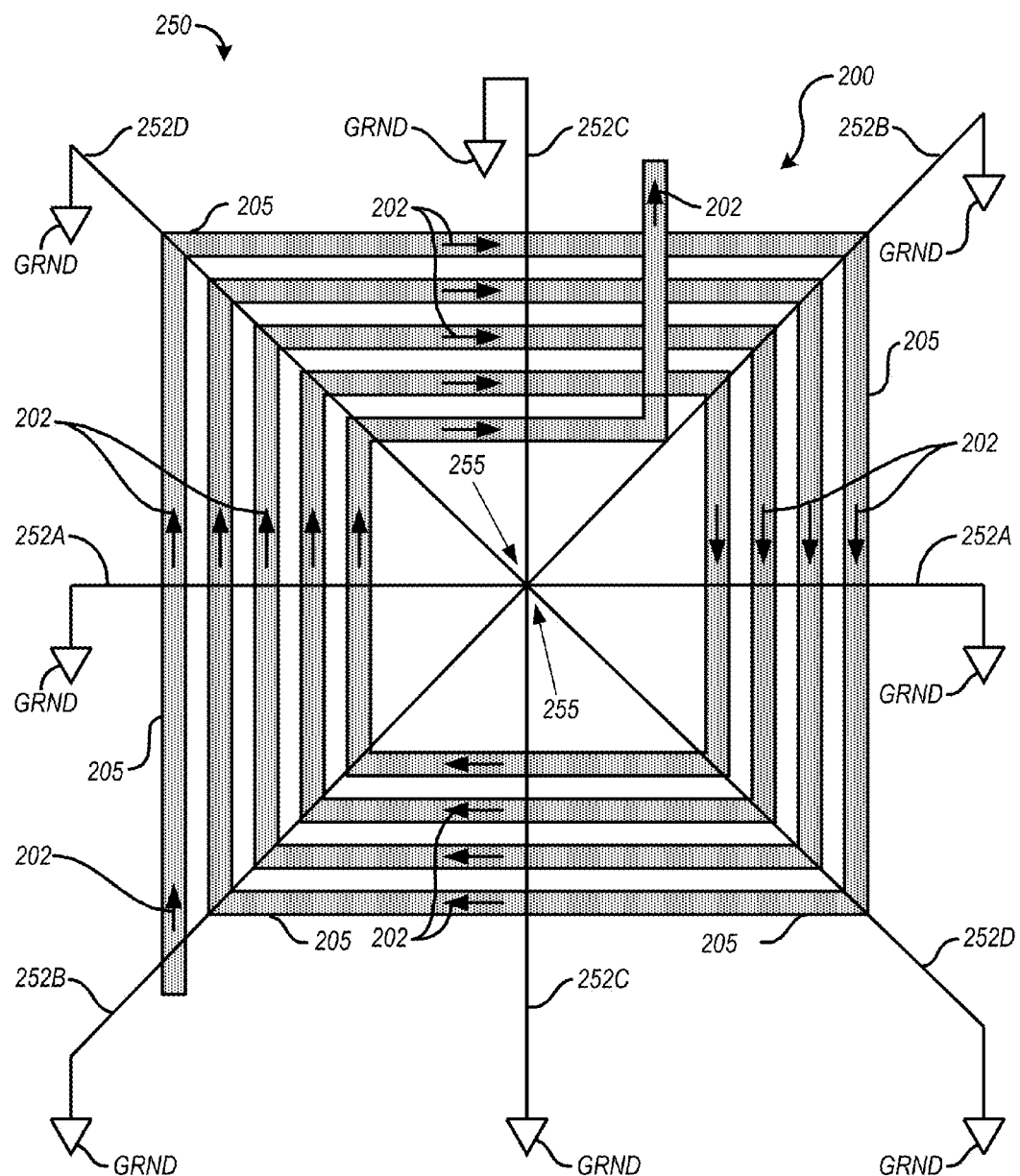
FIG. 5 illustrates a device including an inductor and a plurality of conductive strips, in accordance with an exemplary embodiment of the present disclosure.

FIG. 5 illustrates a device 250, in accordance with an exemplary embodiment of the present disclosure. Device 250 includes inductor 200, which may comprise a planar inductor, and a plurality of conductive wires 252A-252D (e.g., metal wires). More specifically, device 250 includes a first wire 252A, a second wire 252B, a third wire 252C, and a fourth wire 252D. As illustrated, each wire 252A-252D is coupled to a ground GRND, which may comprise a ground voltage, virtual ground, etc. More specifically, each end of each wire 252A-252D may be coupled to ground GRND. Further, each wire may be grounded at an end (i.e., a longitudinal end), which extends beyond a peripheral edge of inductor 200. It is noted that the wires, as shown in FIG. 5, may comprise any conductive material and may also be referred to herein as "strips". Further, one or more conductive wires positioned proximate an inductor and coupled to a ground may be also be referred to herein as an "inductive shield" or simply a "shield". As illustrated, each conductive wire extends from beyond one peripheral edge 205 of inductor 200, and possible beyond another peripheral edge 205 of inductor 200. Stated another way, each conductive wire extends from beyond an outer loop (e.g., outer spiral) of inductor 200 in at least one direction. Further, it is noted that a minor dimension (e.g., a width) of each conductive wire is less than a width of inductor 200.

According to one embodiment, due to the symmetry of the coil currents (i.e., the currents flowing through inductor 200, identified by reference numeral 202) with respect to the axes, a wire (e.g., conductive wires 252A-252D) that is placed along any of the four axes (i.e., one or more of axes 204, 206, 208, and 210) and grounded on both ends positioned outside (i.e., beyond a peripheral edge) of the inductor will not include any substantial induced current (i.e., from the inductor). Stated another way, inductor 200 may not induce any current in the wire extending along a symmetrical axis of inductor 200. According to one embodiment, a plurality of (e.g., four) unconnected and grounded conductive wires 252 (e.g., metal wires) may reduce a magnetic field proximate thereto. More specifically, for example, conductive wires 253 may shield the inductor (e.g., inductor 200) from a magnetic field generated by one or more other electrical components (i.e., aggressor devices). Further, the conductive wires may create a near zero loading effect on the Q-factor of inductor 200. In one specific embodiment, the plurality of wires are not connected (i.e., the wires are isolated physically) near or at the center (i.e., the area where the axes cross) (the wires 252A-252D do not connect at the region 255 (a nonconductive material (not shown) may be at region 255)). Stated another way, each conductive wire is physically isolated from other conductive wires at a region of overlay 255 (i.e., the region area where the axes cross). The conductive shield wires are not joined at the center. In the event the conductive strips were shorted near the center, asymmetrical shield loops may be created and current may be induced by the inductors in those loops, thus, degrading the Q-factor of inductor 200.

Figure 6:
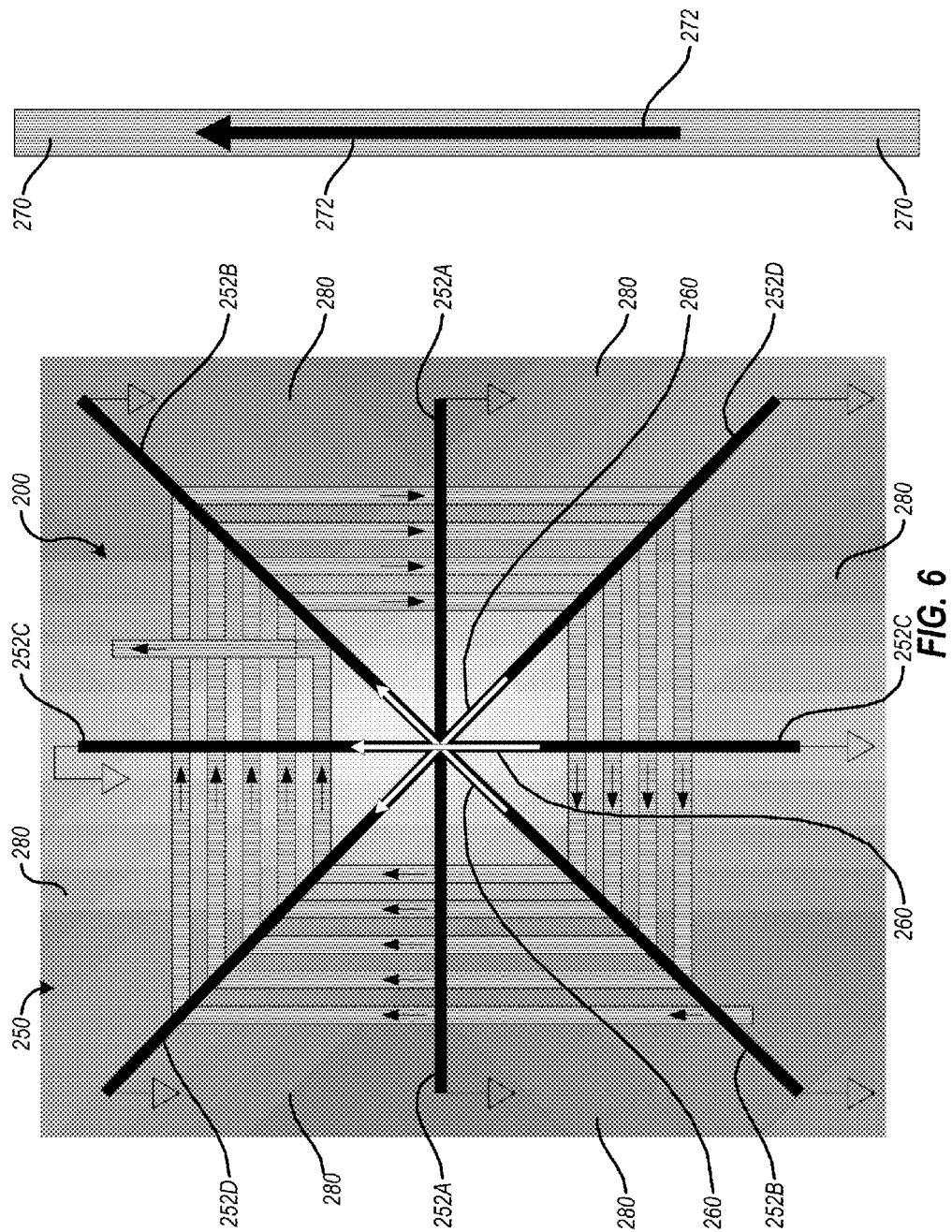
FIG. 6 depicts a device including an inductor, an inductor shield, and an aggressor device.

FIG. 6 illustrates device 250 and an aggressor device 270, which may comprise an electrical component, such as another inductor. As a more specific example, inductor 200 of device 250 may comprise an inductor of a power amplifier input matching circuit and aggressor device 270 may comprise an inductor of a power amplifier output matching circuit. Aggressor current 272 generated by aggressor device 270 may induce offset currents 260, which may cause a reduction in a magnetic field 280 generated by aggressor device 270. Magnetic field 280 is represented via a grayscale shading in FIG. 6, wherein the darker the shading the greater the magnetic field. As will be understood, magnetic field 280 is reduced in regions proximate conductive wires 252A-252D. It is noted that the offset current induced in conductive wire 252C (i.e., by aggressor device 270) may be greater (i.e., in comparison to the offset current induced in, for example, conductive wire 252B) due to aggressor device 270 being in parallel with conductive wire 252C.

Figure 7:
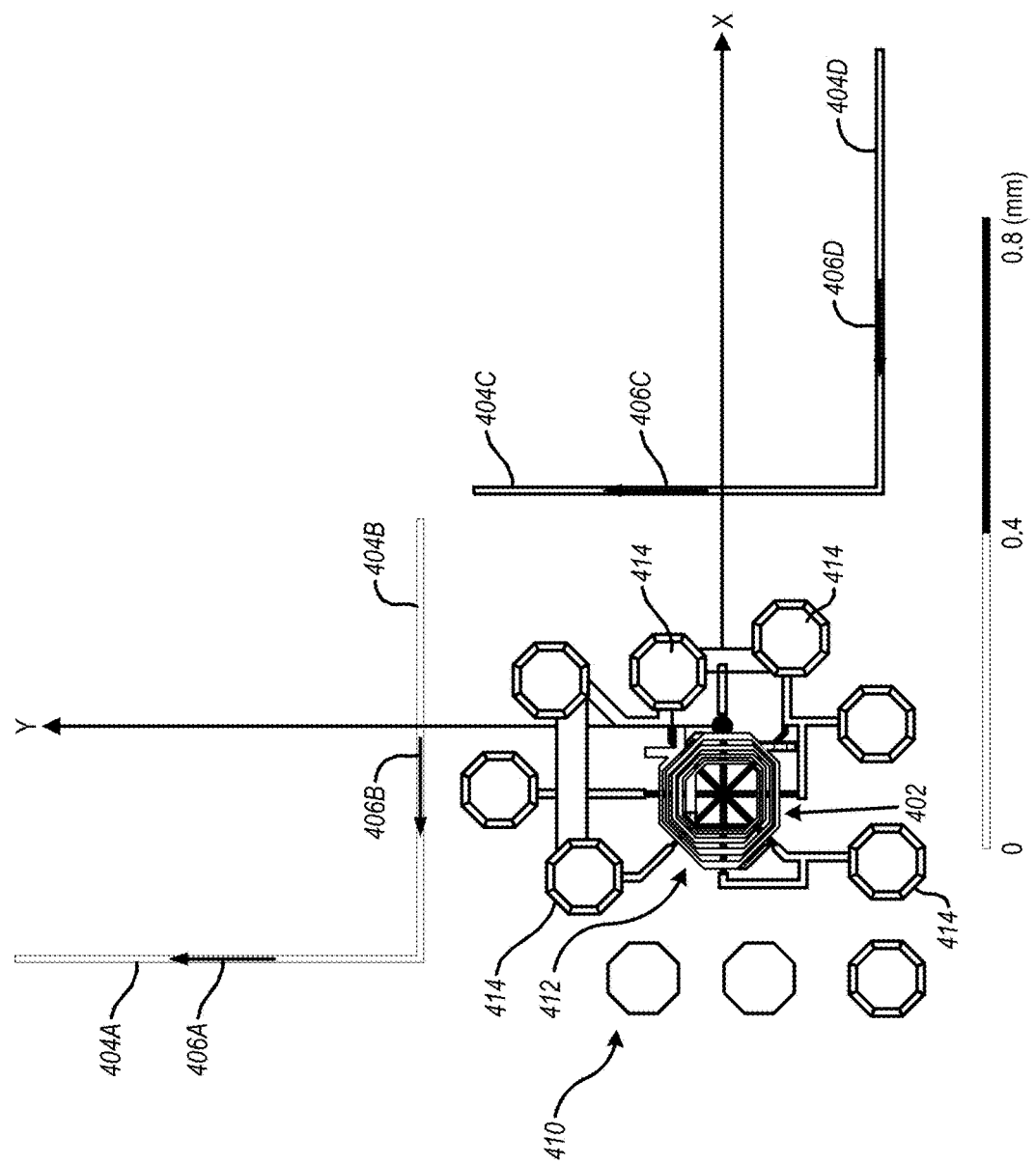
FIG. 7 illustrates an inductor, an inductor shield, and a plurality of aggressor devices.

FIG. 7 illustrates a device 410 including inductor 402 and a shield 412, which may comprise one or more conductive wires, such as conductive wires 252A-252D (see e.g., FIG. 5 and/or FIG. 6). Shield 412 may be coupled to a ground via one or more ground bumps 414. It is noted that a flip chip PA may include one or more ground bumps proximate an input inductor that may be re-used as ground connections for the one or more conductive wires. Further, FIG. 7 depicts aggressor devices 404A, 404B, 404C, and 404D including respective aggressor currents 406A, 406B, 406C and 406D. It is noted that test measurements show use of a shield may decrease coupling (i.e., improves isolation) between an inductor and an aggressor device.

Figure 8:
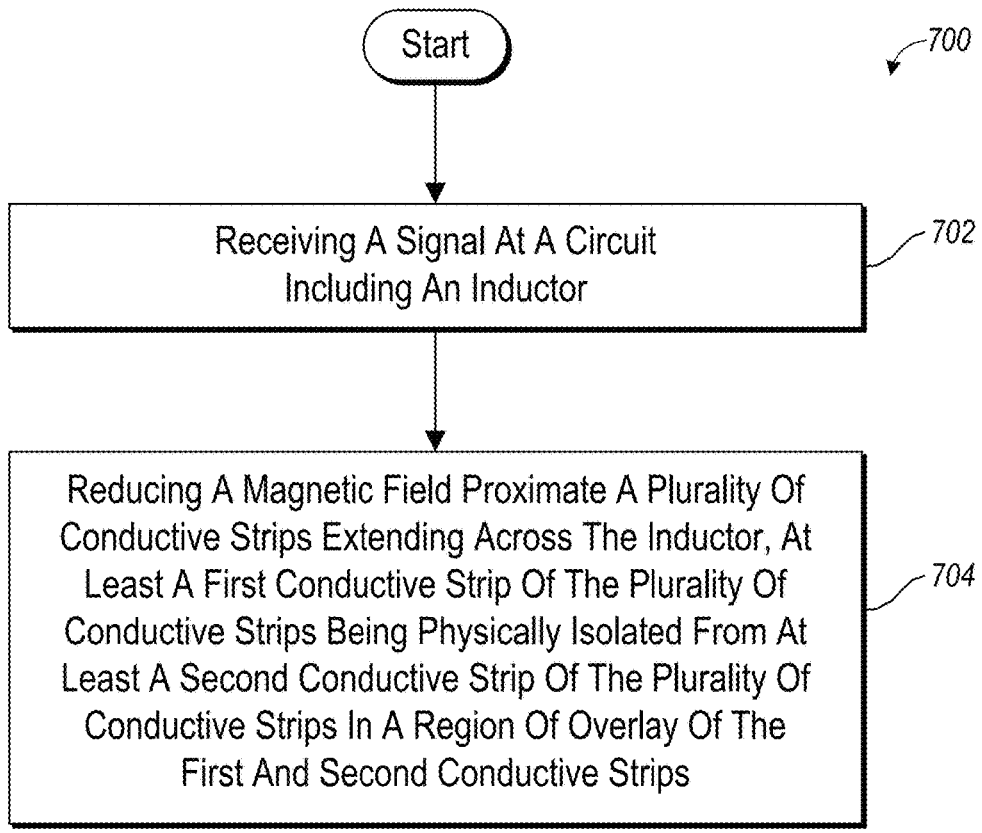
FIG. 8 is a flowchart depicting a method, in accordance with an exemplary embodiment of the present disclosure.

FIG. 8 is a flowchart illustrating a method 700, in accordance with one or more exemplary embodiments. Method 700 may include receiving a signal at a circuit including an inductor (depicted by numeral 702). Method 700 may also include shielding the inductor from a magnetic field generated by an aggressor structure via at least one conductive strip extending from beyond a peripheral edge of the inductor to beyond a second peripheral edge of the inductor and along at least one axis of symmetry of the inductor (depicted by numeral 704).

Figure 9:
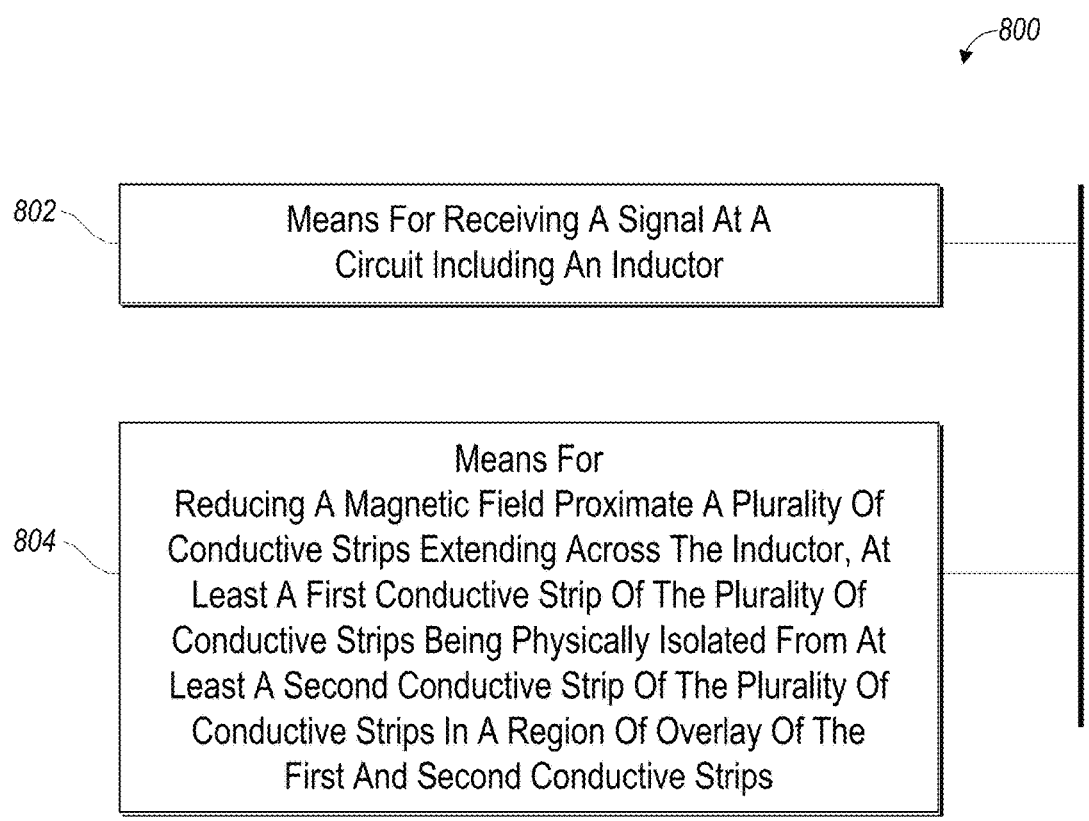
FIG. 9 shows an inductor shielding device, according to an exemplary embodiment of the present disclosure.

FIG. 9 shows an exemplary embodiment of an inductor shielding device 800. For example, device 800 is suitable for use as device 250 in FIG. 5. In an aspect, device 800 is implemented by one or more modules configured to provide the functions as described herein. For example, in an aspect, each module comprises hardware and/or hardware executing software.

Device 800 comprises a first module comprising means (802) for receiving a signal at a circuit including an inductor For example, means 802 may comprise a circuit (e.g., input matching network 154 in FIG. 3) including an inductor (e.g., inductor 200 in FIG. 5).

Device 800 also comprises a second module comprising means (804) for shielding the inductor from a magnetic field generated by an aggressor structure (e.g., another inductor) via at least one conductive strip extending from beyond a peripheral edge of the inductor to beyond a second peripheral edge of the inductor and along at least one axis of symmetry of the inductor. For example, means 804 may include one or more conductive strips 252A-252D, as illustrated in FIG. 5.

In accordance with various exemplary embodiments disclosed herein, a magnetic grounded shield with isolated strips may provide inductor isolation improvement with a relatively small penalty on the inductor Q-factor. The shielding techniques described herein may benefit SOI PA where high current aggressor structures are in the close proximity to the input and inter-stage matching inductors.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is noted that combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

The previous description of the disclosed exemplary embodiments is provided to enable any person skilled in the art to make or use the present disclosure. Various modifications to these exemplary embodiments will be readily apparent to those skilled in the art, and the generic principles defined herein may be applied to other embodiments without departing from the spirit or scope of the disclosure. Thus, the present disclosure is not intended to be limited to the exemplary embodiments shown herein but is to be accorded the widest scope consistent with the principles and novel features disclosed herein.

What is claimed is:

1. A device comprising:
    an inductor, the inductor being substantially symmetrical; and
    a plurality of conductive strips extending across the inductor, the plurality of conductive strips including at least three conductive strips that extend along three symmetrical axes of the inductor, at least a first conductive strip of the plurality of conductive strips being physically isolated from at least a second conductive strip of the plurality of conductive strips in a region of overlay of the first and second conductive strips, the first conductive strip having a first end coupled to a ground voltage and a second end coupled to the ground voltage, and the second conductive strip having a first end coupled to the ground voltage and a second end coupled to the ground voltage.

2. The device of claim 1, the inductor comprising at least one of a spiral square-shaped inductor, a spiral round-shaped inductor, and a spiral octagon-shaped inductor.

3. The device of claim 1, the inductor comprising a substantially symmetrical spiral inductor including one or more symmetrical axes.

4. The device of claim 3, the plurality of conductive strips extending along at least one symmetrical axis of the one or more symmetrical axes.

5. The device of claim 1, wherein the ground voltage corresponds to a virtual ground.

6. The device of claim 1, wherein at least one longitudinal end of each conductive strip of the plurality of conductive strips is coupled to a ground bump of a flip chip power amplifier.

7. The device of claim 1, the plurality of conductive strips comprising:
    the first conductive strip extending along a first symmetrical axis of the one or more symmetrical axes of the inductor;
    the second conductive strip extending along a second symmetrical axis of the one or more symmetrical axes;
    a third conductive strip extending along a third symmetrical axis of the one or more symmetrical axes; and
    a fourth conductive strip extending along a fourth symmetrical axis of the one or more symmetrical axes.

8. The device of claim 1, each conductive strip of the plurality of conductive strips extending beyond an outer loop of the inductor.

9. The device of claim 1, further comprising a matching circuit including the inductor.

10. The device of claim 9, further comprising a power amplifier coupled to the matching circuit, the power amplifier comprising one of a gallium arsenide (GaAs) power amplifier and a complementary metal-oxide semiconductor (CMOS) power amplifier.

11. The device of claim 10, further comprising an integrated circuit (IC) including the matching circuit and the power amplifier.

12. The device of claim 1, wherein the inductor comprises a spiral, planar inductor.

13. The device of claim 1, wherein each longitudinal end of each conductive strip of the plurality of conductive strips is coupled to ground.

14. The device of claim 1, wherein an amount of current induced in the plurality of conductive strips by the inductor is substantially zero amps.

15. A method comprising:
    receiving a signal at a circuit including an inductor, the inductor being substantially symmetrical; and
    reducing a magnetic field proximate a plurality of conductive strips extending across the inductor, the plurality of conductive strips including at least three conductive strips that extend across three symmetrical axes of the inductor, at least a first conductive strip of the plurality of conductive strips being physically isolated from at least a second conductive strip of the plurality of conductive strips in a region of overlay of the first and second conductive strips, the first conductive strip having a first end coupled to a ground voltage and a second end coupled to the ground voltage, and the second conductive strip having a first end coupled to the ground voltage and a second end coupled to the ground voltage.

16. The method of claim 15, wherein reducing a magnetic field comprises shielding the inductor from the magnetic field generated by an aggressor structure via the plurality of conductive strips wherein each axis of symmetry of the inductor includes a conductive strip of the plurality of conductive strips extending along thereof.

17. A device comprising:
    means for receiving a signal through a circuit including an inductor, the inductor being substantially symmetrical; and
    means for reducing a magnetic field proximate a plurality of conductive strip extending across the inductor, the plurality of conductive strips including at least three conductive strips that extend across three symmetrical axes of the inductor, at least a first conductive strip of the plurality of conductive strips being physically isolated from at least a second conductive strip of the plurality of conductive strips in a region of overlay of the first and second conductive strips, the first conductive strip having a first end coupled to a ground voltage and a second end coupled to the ground voltage, and the second conductive strip having a first end coupled to the ground voltage and a second end coupled to the ground voltage.

18. The device of claim 17, further comprising means for coupling each conductive strip of the plurality of conductive strips to ground.

19. The device of claim 17, the means for reducing comprising means for inducing a current in at least one conductive strip of the plurality of conductive strips.

20. The device of claim 1, wherein each conductive strip of the at least three conductive strips extends along a different symmetrical axis of the inductor than the other two conductive strips of the at least three conductive strips.

* * * * *